US 6,630,814 B2

(12) United States Patent
Ptasinski et al.

(10) Patent No.: US 6,630,814 B2
(45) Date of Patent: Oct. 7, 2003

(54) METHOD AND APPARATUS FOR CALIBRATING A RECHARGEABLE BATTERY

(75) Inventors: Kristoffer Ptasinski, Lund (SE); Charles Forsberg, Skurup (SE); Sarandis Kalogeropoulos, Malmo (SE); Rickard Andersson, Lund (SE); Petrus Evers, Darban, NC (US); Anders Langberg, Trelleborg (SE); David Demers, Wake Forest, NC (US); Jeremy Carlson, Cary, NC (US); Derek Liddle, Hampshire (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/859,237

(22) Filed: May 16, 2001

(65) Prior Publication Data

US 2002/0167293 A1 Nov. 14, 2002

Related U.S. Application Data

(60) Provisional application No. 60/256,734, filed on Dec. 19, 2000.

(51) Int. Cl.[7] .............................................. H01M 10/46
(52) U.S. Cl. ....................................................... 320/132
(58) Field of Search .................................. 320/132, 149

(56) References Cited

U.S. PATENT DOCUMENTS

| | | | |
|---|---|---|---|
| 4,151,454 A | 4/1979 | Iida | 320/48 |
| 4,390,841 A | 6/1983 | Martin et al. | 324/427 |
| 4,912,392 A | 3/1990 | Faulkner | |
| 5,325,041 A | 6/1994 | Briggs | |
| 5,596,260 A | 1/1997 | Moravec et al. | 320/30 |
| 5,963,017 A | 10/1999 | Yeh et al. | 320/132 |
| 5,965,997 A | 10/1999 | Alwardi et al. | 320/132 |

FOREIGN PATENT DOCUMENTS

| | | |
|---|---|---|
| DE | 296 20628 | 7/1997 |
| DE | 196 34268 | 4/1998 |
| EP | 0124739 | 3/1984 |
| EP | 0359237 A2 | 3/1990 |
| EP | 0864877 | 3/1997 |
| EP | 0766365 | 9/1997 |
| EP | 0965906 | 12/1999 |
| GB | 2246916 | 2/1992 |
| JP | 03-199984 | 8/1991 |
| JP | 2000-069606 | 3/2000 |
| WO | WO 99/63613 | 12/1999 |

OTHER PUBLICATIONS

Copy of International Search Report in PCT Application No. PCT/EP 01/14956 mailed Nov. 25, 2002.

*Primary Examiner*—Edward H. Tso
(74) *Attorney, Agent, or Firm*—Jenkens & Gilchrist, P.C.

(57) ABSTRACT

Method and apparatus for calibrating a rechargeable battery for mobile telephones and other electronic devices. Calibration is accomplished during a process of completely charging the battery by determining the total amount of charge accepted by the battery during the charging process, and providing a value of total charge capacity of the battery based, at least in part, on the total amount of charge accepted by the battery. The total charge capacity of the battery is used to calculate remaining battery capacity and to predict the remaining operational time of the device. Alternative calibration procedures are provided if the battery is not completely discharged before charging or if the battery is not fully charged by the charging process. The calibration procedures of the invention require no interaction from a user (other than his initiating the normal charging process), and typically permits a calibration to be carried out notwithstanding varying usage habits of different users.

46 Claims, 10 Drawing Sheets

METHOD AND APPARATUS FOR CALIBRATING A RECHARGEABLE BATTERY

This application is a Continuation of prior application Ser. No. 60/256,734 filed on Dec. 19, 2000, now pending.

This application claims the benefit of U.S. Provisional Application Ser. No. 60/256,734 filed on Dec. 19, 2000.

BACKGROUND OF THE INVENTION

1. Field of the Invention

The present invention relates generally to the field of battery powered electronic devices; and, more particularly, to a method and apparatus for calibrating a rechargeable battery for mobile telephones and other portable electronic devices.

2. Description of the Prior Art

Many types of electronic devices utilize battery power instead of or in addition to A/C power from an outlet. For example, mobile telephones and other mobile terminals, laptop computers, camcorders, etc., usually utilize rechargeable batteries; and a variety of types of rechargeable batteries have been developed for use in such applications including nickel-cadmium batteries, nickel metal hydride batteries and lithium ion batteries.

A user of a portable electronic device often wishes to know the operational time remaining with an installed battery so as to be able to properly plan for future usage of the device, and to generally know when the battery should be recharged. For example, a user of a mobile telephone may wish to know if expected calls can be made or received, that the phone can be properly used when taken on a long trip, etc.

Recognizing the importance of providing users of portable electronic devices with information concerning the remaining operational time of their devices, manufacturers often provide portable electronic devices, such as mobile telephones, with a "fuel gauge" capability by which the remaining capacity of a battery maybe monitored. In general, a fuel gauge calculates the remaining capacity of the battery as follows:

Remaining battery capacity=Total battery capacity−Used battery capacity

A mobile telephone, for example, can measure the total current that is fed into it from the battery, and from this information can calculate how much capacity is withdrawn from the battery (i.e., used battery capacity). If it also knows the total recoverable battery capacity (usually referred to herein simply as the "total battery capacity"), it can easily calculate the remaining battery capacity using the above equation. Once the remaining battery capacity is known, the telephone can predict the remaining "talk" and "standby" times for the telephone and provide this information to the user via a display or the like.

In order to avoid possible confusion, it should be noted that the term "battery" as used herein generally refers to a "battery pack" as is used to power many electronic devices. A battery pack typically includes one or a plurality of individual rechargeable battery cells. The individual battery cell is generally referred to herein as a "battery cell" or, more simply, as a "cell".

A value indicative of the total capacity of a cell is typically provided by the vendor of the cell, and a value indicative of the total capacity of the battery can be determined from this information. In the case of "dumb batteries", when the software for an electronic device is originally designed, the total battery capacity value is programmed into the device. With respect to "smart batteries", the total battery capacity value is provided in a memory storage device associated with the battery; and the device is able to communicate with the battery to obtain the total battery capacity value.

The total cell capacity value provided by the cell vendor, however, is a "nominal value", i.e., an average minimum capacity value of a fully charged cell for a particular cell type. Because it is an average minimum capacity value, it can differ significantly from the actual total capacity of individual cells of that particular type (a difference of as much as 20% has been observed); and, accordingly, the total capacity value of a battery incorporating the cell or cells can also differ significantly from the actual total capacity of that battery. This difference can have a very significant negative impact on the accuracy of the fuel gauging.

Recognizing the inadequacies of basing a determination of remaining battery capacity on the "nominal value" provided by the vendor of the battery cell, it is known that the battery should be periodically calibrated in order to increase the accuracy of the fuel gauging. The calibration process, in effect, endeavors to accurately determine the actual total capacity of the battery at the specific time that the calibration is performed so that the calibrated value maybe used by the mobile phone or other electronic device to more accurately calculate the remaining battery capacity.

One well-known calibration procedure is based on the ageing of the battery. Specifically, it is well-known that the total capacity of a battery degrades as an effect of ageing; and to calibrate a battery using this procedure, the electronic device monitors the ageing process and adjusts the total battery capacity value as a function of battery ageing for use when calculating the remaining capacity of the battery.

Usually, the ageing of a battery is estimated by the electronic device based upon the number of completed charging cycles. Such an estimate, however, is only a rough estimate (a straight line estimate) and is not very accurate. In actuality, the effect of ageing is different for each individual battery and varies depending on a number of factors including temperature and usage intensity. In general, battery ageing is a very unpredictable process and current battery ageing estimations are not sufficient to provide an accurate measure of remaining battery capacity; and, hence, prevent an accurate estimation of remaining operational time of a device using the battery.

Various other procedures for calibrating a battery for a mobile telephone are known. These procedures are typically required to be initiated by the user of the telephone. In addition, if no dedicated hardware is added to the phone, the calibration procedure can take a very long time; and, since the phone normally cannot be used during the procedure, this can be a great inconvenience to the user. For example, in known calibration procedures, a fully charged battery is usually used. The battery is discharged completely while measuring the current and time; i.e., the capacity withdrawn from the battery, so as to provide a measure of the total capacity of the battery. Inasmuch, however, as mobile telephones may have a standby time of hundreds of hours, such a calibration procedure may require as much as several days.

SUMMARY OF THE INVENTION

The present invention provides a method and apparatus for calibrating a battery used, for example, to power a mobile terminal, such as a mobile telephone, or another electronic device.

A method for calibrating a rechargeable battery for an electronic device according to the present invention comprises the steps of charging the battery by a charging process, determining a total amount of charge accepted by the battery during the charging process, and providing a value of total battery capacity of the battery based, at least in part, on the total amount of charge accepted by the battery.

With the present invention, an accurate calibration of the battery can be carried out in a relatively short period of time during charging of the battery. For example, mobile telephones manufactured by the assignee of the present invention charge batteries using a fast charging algorithm, such that a complete charging cycle typically lasts no more than 1–2 hours. With the present invention, therefore, the battery can also be accurately calibrated in this period of time. In general, it is contemplated that a calibration according to the present invention will be carried out automatically during a typical overnight charging cycle so as to minimize possible inconvenience to the user.

According to a presently preferred embodiment of the invention, the step of determining a total amount of charge accepted by the battery comprises determining the net current fed into the battery during the charging process and the duration of the charging process; from which information, the total amount of charge accepted by the battery can be readily calculated.

The net current fed into the battery is determined by determining the charging current and the current consumption of the electronic device during the charging process (it should be noted that the device itself will normally consume some amount of current during the charging process), and calculating the net current fed into the battery therefrom. The charging current and the current consumption of the device can be determined, for example, by measurement of these values during the charging process, by suitable estimation procedures, by accumulation of the current fed into the battery or by any other appropriate technique. As one example, the charging current and the current consumption of the device can be measured, and the net current fed into the battery calculated therefrom. The net current fed into the battery, multiplied by the duration of the charging cycle, will represent a value of the total charge accepted by the battery during the charging process.

According to one presently preferred embodiment of the invention, the battery is completely discharged before the charging process is begun; and the charging step comprises fully charging the battery. In such circumstances, the total amount of charge accepted by the battery equals a value indicative of the total capacity of the battery. This value is then used to update the total battery capacity parameter provided by the cell vendor or previously calculated to permit remaining battery capacity to be more accurately calculated.

According to a further embodiment of the invention, it is not necessary to completely discharge the battery before the charging process is begun. Instead, a value representing the remaining capacity of the battery before it is charged is provided, and this value is added to the total amount of charge accepted by the battery during the charging process to provide the total battery capacity value.

Preferably, the step of providing a value representing the remaining battery capacity is made utilizing a "remaining battery capacity estimation" procedure according to yet a further embodiment of the present invention. In accordance with this procedure, the battery comprises at least one battery cell; and the voltage across the at least one cell is first determined, and this value is then used to determine the value representing the remaining battery capacity. The step of determining the voltage across the cell preferably comprises measuring the voltage across the battery terminals (i.e., the battery voltage) when battery current is sufficiently low, e.g., less than about 10 mA, such that the battery voltage and the cell voltage will be substantially equal, and after a period of time sufficient to stabilize any chemical reactions taking place in the at least one cell. The determined remaining battery capacity value is stored, and after the battery has been fully charged by the charging process, this stored value is added to the total amount of charge accepted by the battery during the charging process to provide the total battery capacity value.

In general, by providing a reliable value for the remaining capacity of the battery, complete discharge of the battery before charging is unnecessary. This can both simplify and speed up the overall calibration procedure somewhat.

The calibration procedure according to the present invention generally requires that the charging process be completed, i.e., that the battery be completely charged, so that an accurate total battery capacity value can be obtained. The present invention recognizes, however, that many users of portable electronic devices do not always permit the charging process to be completed for one reason or another. For example, when the battery is used in a mobile phone, the charging process might be interrupted to make a call. Also, high or low battery temperatures or other factors can also interfere with the charging process so as to prevent the battery from being fully charged.

According to a further embodiment of the invention, accordingly, if the charging process is interrupted or otherwise interfered with such that a complete charging of the battery can not be properly accomplished, an alternative calibration procedure is performed to ensure that the battery is calibrated in any event. For example, a calibration procedure based on the ageing of the battery can be carried out to provide an adjusted total battery capacity value. This will, at least, provide some degree of calibration when a full charging cycle is not carried out. Alternatively, and in accordance with further embodiments of the invention, a dynamic total battery capacity updating procedure can be performed during normal use of the device to permit adjustment of the total battery capacity value. These total battery capacity updating procedures can be used in conjunction with the normal calibration procedure during charging of the battery as described above, or separately as independent calibration procedures.

When a calibration procedure according to the present invention indicates that the total capacity value of the battery should be adjusted, it is preferred that the adjustment, whether it be an increase or a decrease in the value, be by no more than some maximum amount pursuant to any one calibration even if the results of the calibration indicate that a greater adjustment is needed. Such maximum amount can, for example, be a percentage of the previously stored total battery capacity value (e.g., 10%), a percentage of the amount of the adjustment indicated as being needed (e.g., 25–50%), or some other selected amount. By limiting the amount of the adjustment as a result of any one calibration, if an erroneous calibration does occur, it will have only a limited impact on the performance of the fuel gauging algorithm used by the device; and, in addition, it will prevent extreme adjustments to the total battery capacity value that might be noticeable to the user.

The present invention generally provides a calibration method and apparatus that can make fuel gauging more accurate than in many prior techniques, and that can more reliably provide the user of an electronic device with better information regarding the remaining operational time of the device. One reason for the increased accuracy is that errors that do occur during a calibration procedure tend to be cumulative in nature. Because, in the present invention, calibration can usually be done in less time than by prior methods, fewer errors are likely to occur such that the accumulated errors are also likely to be less.

In general, the present invention also provides a calibration procedure that is fully automatic and does not require any interaction from the user, other than the user initiating the normal process for charging the battery. The procedure is also fully adaptive inasmuch as a calibration will be performed at all available opportunities while, at the same time, a calibration will generally not be performed when there is a substantial risk of incorrect measurements. An important feature of the present invention is that it recognizes that different users of electronic devices have differing habits with respect to their use and handling of their devices; and endeavors to ensure that some type of calibration is periodically carried out irrespective of the user's habits. The procedure of the invention also provides a convenient means to monitor the degradation of the battery due to ageing and/or other factors.

The above and further advantages, objects and features of the present invention will become readily apparent hereinafter in conjunction with the following detailed description of presently preferred embodiments thereof.

DETAILED DESCRIPTION OF PRESENTLY PREFERRED EMBODIMENTS

Figure 1:
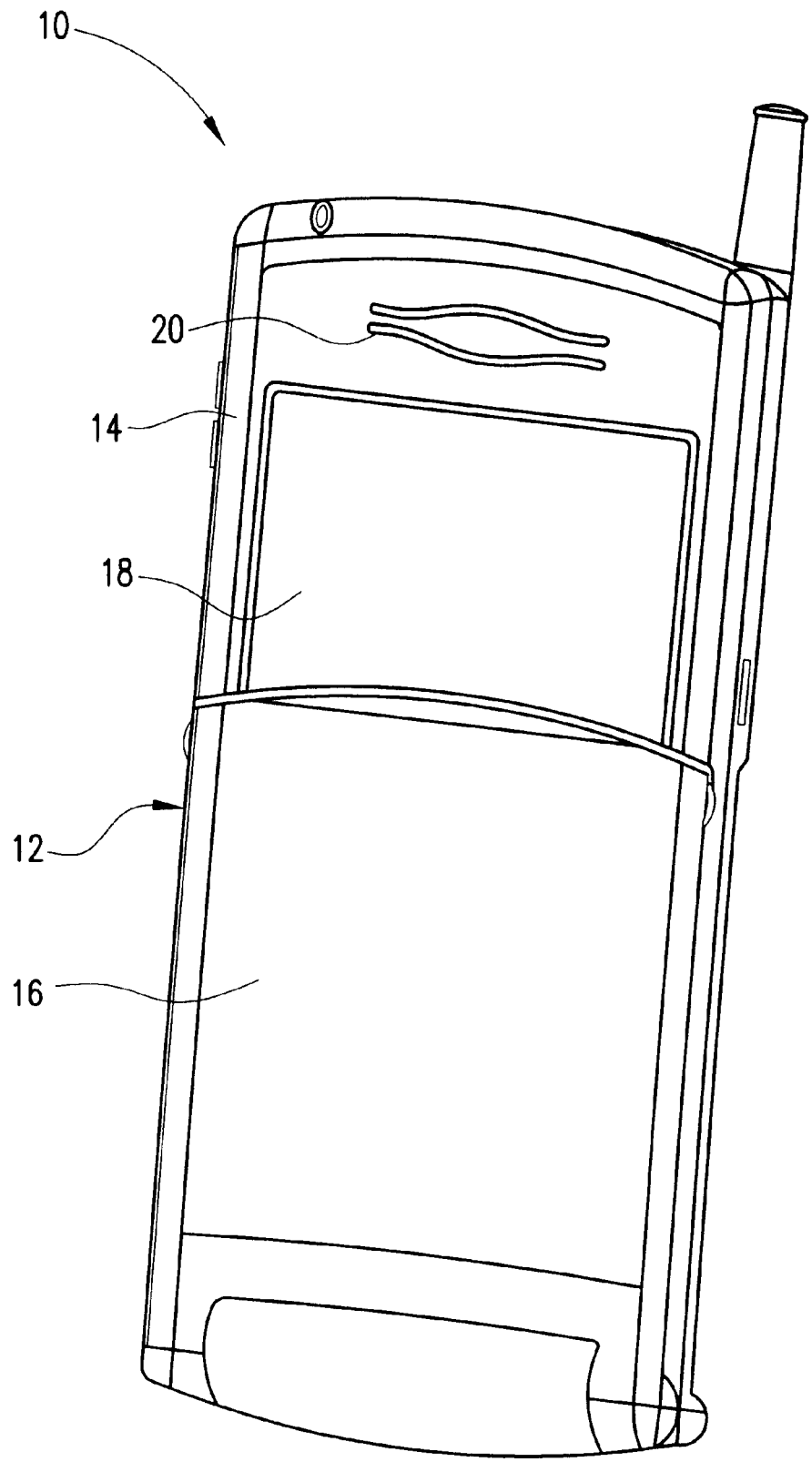
FIG. 1 is a front perspective view of a mobile telephone incorporating a rechargeable battery to assist in explaining the present invention.
Figure 2:
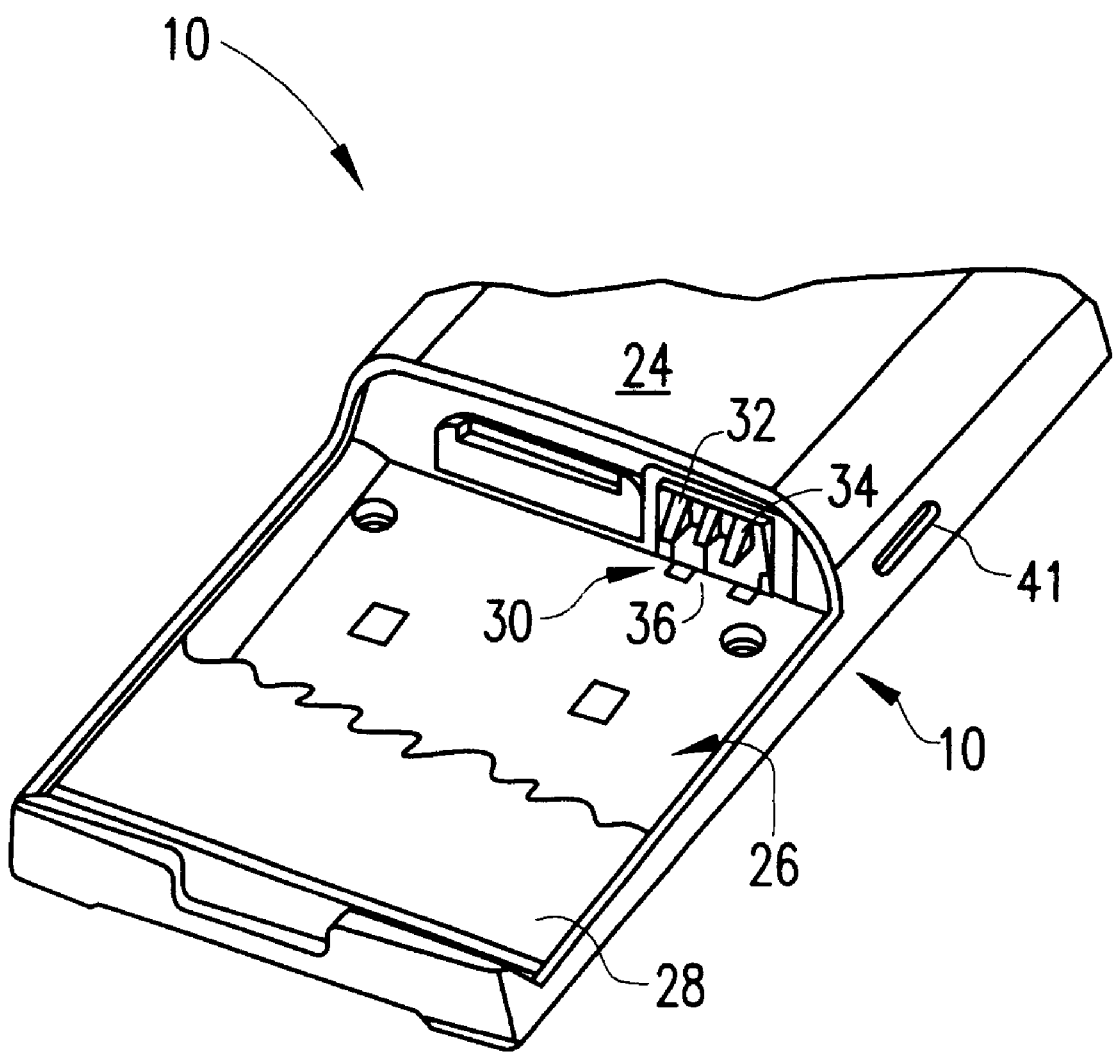
FIG. 2 is a partial rear perspective view of the mobile telephone of FIG. 1 with the battery cover thereof removed to illustrate details of the telephone.

FIGS. 1 and 2 are front and rear perspective views, respectively, illustrating a mobile terminal in the form of a handheld mobile telephone used in a cellular telecommunications system. The telephone is generally designated by reference number 10; and includes a main housing 12 having a front surface 14 which provides access to a keypad (behind a cover 16 and, therefore, not shown), a display 18 and a speaker 20.

As best shown in FIG. 2, a rear surface 24 of housing 12 has a cavity 26 in which a battery 28 (only a portion of which is illustrated in FIG. 2) is adapted to be positioned. An interface 30 in the cavity, which includes three terminals 32, 34, and 36 in the illustrated telephone to permit the phone to be used with and to identify different types of batteries, is provided to electrically couple the battery and the telephone as is known to those skilled in the art.

The battery 28 can be of various types and constructions as is also known to those skilled in the art. Frequently, battery 28 comprises a smart battery which normally includes, in addition to one or more individual cells, appropriate memory storage devices and a microcontroller which allows communication between the battery and the telephone 10. For example, as indicated previously, smart batteries typically have stored therein information regarding the nominal total capacity of the battery for use by the telephone in calculating remaining battery capacity.

As is also well-known to those skilled in the art, the mobile telephone 10 includes appropriate signal processing circuitry within the main housing 12 thereof for operating the phone in a designated mode of communication. In addition, the telephone 10 may include circuitry which enables the battery 28 to be charged while it is positioned within the cavity 26. Specifically, the charging circuit, which can take various well-known forms, supervises the overall charging process by controlling the total amount of current passing from the charger into the phone and into the battery.

Figure 3:
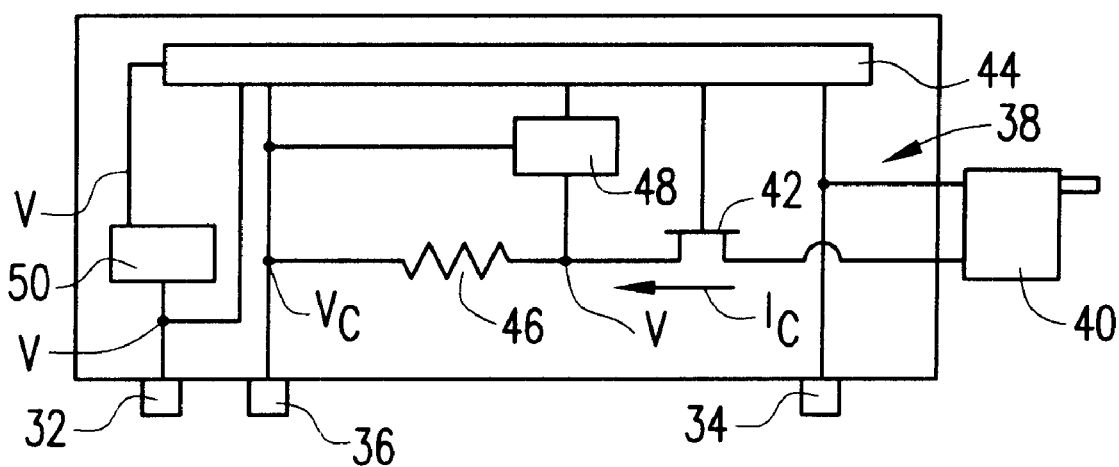
FIG. 3 schematically illustrates an exemplary charging circuit which may be incorporated in the mobile telephone of FIGS. 1 and 2.

FIG. 3 schematically illustrates one example of a charging circuit 38 which may be incorporated in telephone 10 to supervise the charging of battery 28 while it is located in cavity 26 of the telephone. It should be understood, however, that other charging circuits and charging procedures can also be used without departing from the scope of the present invention. For example, charge control may be via linear control of a charging FET.

In FIG. 3, charging circuit 38 provides a path between the battery 28 and a current source 40 (e.g., an AC/DC adapter from an ordinary wall outlet plugged into slot 41 in the telephone, see FIG. 2), preferably through a suitable switching device 42 to better control the charging process.

A microcomputer 44 or other similar printed circuit module is included in the circuit 38 and contains the various charging algorithms for charging the battery 28. The particular algorithms used will depend on the battery type and the nature of the charging process. The microcomputer 44 controls the switching device 42 by modulating it at a specified frequency to provide the level of charging current Ic required to charge the battery, and monitors the charging current to ensure that the charging is in accordance with the charging algorithm being utilized. This can be done by reading the voltage drop across the load 46 represented as a resistor. A differential amplifier 48 is provided in the circuit and receives voltages Va and Vc at the inputs thereof to add gain so the difference therebetween sent to microcomputer 44 is at a level which permits monitoring of the charging current Ic.

A voltage regulator 50 is also included in the circuit between contact 32 and the microcomputer to provide a regulated voltage Vr as a power supply to the microcomputer and to terminate charging of the battery when the voltage Vb reaches a specified level.

Further details of the charging circuit 38 and its operation will be well-known to those skilled in the art; and, thus, need not be described herein.

As indicated above, the telephone 10 (via the microcomputer 44) can measure or otherwise determine the total amount of current passing from the charger 40 into the phone and into the battery 28 (in this regard, as indicated previously, the telephone also consumes some amount of current during the charging process, for example, to power the microcomputer 44). Therefore, the phone can easily calculate the net current fed into the battery during the charging process. The phone also monitors and, thus, knows the duration of the complete charging cycle; and, therefore, it can also calculate the total capacity accepted by the battery during the charging process. From this information, a value representing the total capacity of the battery can be determined; and, thus, calibration of the battery can be readily accomplished as the battery is being charged.

As indicated previously, existing battery calibration procedures generally start with a fully charged battery and perform the calibration during a discharge of the battery. Specifically, the battery is discharged completely while measuring the current and time (i.e., the capacity withdrawn from the battery).

As also indicated previously, this procedure is generally not suitable for mobile phones having a standby time of hundreds of hours as several days would be required to complete the procedure unless dedicated hardware is added to the phone.

In accordance with a presently preferred embodiment of the present invention, however, battery calibration is performed during a normal charging cycle of the battery. Since all phones manufactured by the assignee of the present application use very fast charging algorithms such that a complete charging cycle lasts no more than about 1–2 hours, an effective calibration according to the present invention can also be completed in that period of time; or, more commonly, during a typical overnight charging of the battery.

Figure 4:
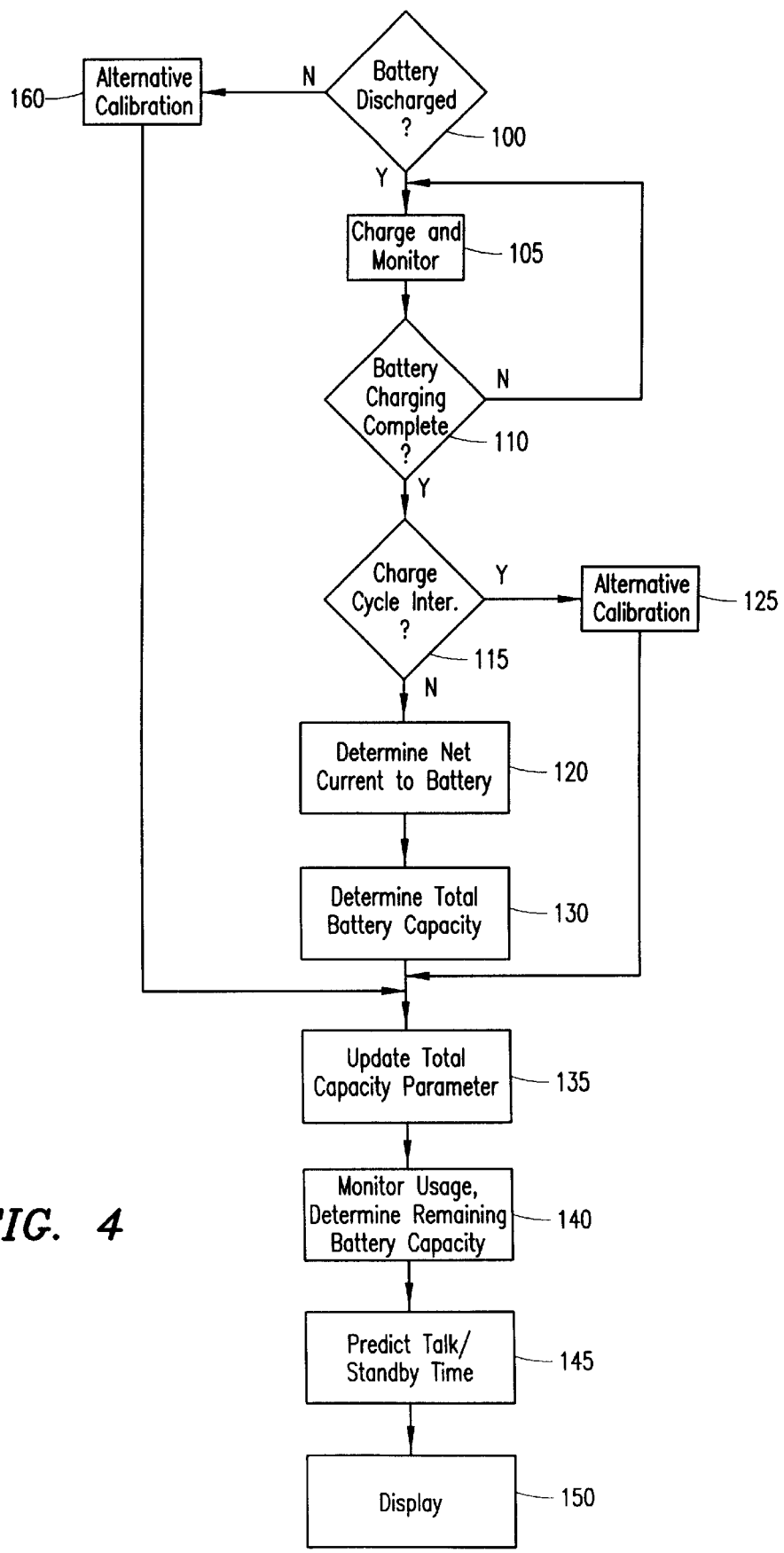
FIG. 4 is a flow chart illustrating steps for providing a user with remaining operational time of the mobile telephone of FIGS. 1 and 2, including steps of a battery calibration procedure according to a presently preferred embodiment of the invention.

FIG. 4 is a flow chart which illustrates steps of a procedure by which a user of a mobile telephone 10 can be advised of the remaining operational time of the phone, including the steps of a calibration procedure according to a presently preferred embodiment of the invention.

Initially, according to the embodiment, the battery to be charged should first be fully discharged before the charging process is initiated (Y output of step 100). The battery is then fully charged utilizing any conventional or other desired charging procedure (step 105). As the battery is being charged, the phone monitors the charging process so as to be able to determine the total amount of charge accepted by the battery during the process.

Charging of the battery continues until charging is completed (Y output of step 110); and, at this time, the battery should be fully charged if there has been no interruption or other interference of the charging cycle that would prevent the battery from having been fully charged (N output of step 115). When the battery is fully charged, the net current passing into the battery is determined (step 120); and since the phone also monitors and knows the duration of the charging cycle, it can calculate how much capacity has been accepted by the battery during the charging process (step 130). Because, in this embodiment, the battery was fully discharged before charging commenced, the total capacity accepted by the battery will be a value equal to the total maximum capacity of the battery. This value is then used to update the total battery capacity parameter of the battery (step 135) to make fuel gauging more accurate.

During subsequent use of the mobile phone 10, following the charging process, the phone monitors the usage of the battery as is known to those skilled in the art, and calculates the remaining battery capacity by subtracting the used battery capacity from the updated total battery capacity value provided by the calibration (step 140). The remaining battery capacity is then used to predict the remaining talk/standby time of the phone (step 145) which is provided to the user via display 18 or the like (step 150) as is also known to those skilled in the art.

With the battery calibration procedure of the present invention as described above, it is not necessary to use the inherently inaccurate nominal total battery capacity value provided by the vendor of the cell or to calibrate the battery using the rough estimate based on ageing of the battery. In this regard, the method of the invention also provides a convenient way to accurately monitor battery degradation due to ageing and/or other causes.

According to a presently most preferred embodiment of the invention, it is recommended that the step of updating the total capacity value of the battery (step 135) adjust the value (increase or decrease) by no more than a maximum amount pursuant to any one calibration even if the results of the calibration indicate that a greater adjustment is needed. For example, the maximum amount can be set as some predetermined percentage of the previous total battery capacity value (e.g., 10% or less), some percentage of the amount of adjustment indicated as being needed (e.g., 25–50%), or some other suitable amount. By providing a maximum adjustment for any one calibration, if an erroneous calibration does occur, for any reason, it will have only a limited impact on the performance of the fuel gauging algorithm used by the phone and the adjustment will not be as noticeable to the user.

For the calibration procedure described above to be effective, it is important that the charging process not be interrupted before the battery is fully charged. If the charging process is interrupted for any reason before the battery is fully charged (Y output of step 115 in FIG. 4), or if the charging process is otherwise not functioning properly such that a complete charging of the battery is not achieved; it is preferred that an alternative type of calibration be made (step 125). For example, an alternative calibration can be based on estimation of the ageing of the battery using the conventional straight line model as described previously. Alternatively, the calibration can be in accordance with dynamic total battery capacity updating procedures according to further embodiments of the present invention which will be described hereinafter. The provision of an alternative calibration procedure is particularly important in the case of users who frequently prevent a charging cycle from being completed for one reason or another, so as to permit a calibration to be performed, in any event.

According to a further embodiment of the present invention, if the battery is not fully discharged before initiating the charging process (N output of step 100), calibration of the battery is also accomplished by an alternative calibration procedure, step 160. Preferably, this alternative procedure involves providing a value representing the remaining capacity of the battery (any existing capacity of the battery) at the time the charging process is initiated; and adding this value to the total capacity accepted by the battery during the charging process to provide a total battery capacity value which can then be used to update the total battery capacity parameter used for gauging as shown in FIG. 4.

By eliminating the discharging requirement, the overall calibration process can be simplified somewhat; and the calibration can be performed in a somewhat shorter period of time. However, in order for the calibration to be accurate under such circumstances, it is important that the value of the remaining capacity of the battery, that is added to the accepted capacity of the battery during the charging process, to provide the total battery capacity value, be an accurate value as well.

Accordingly, although a value representing the remaining battery capacity can be determined using any suitable procedure without departing from the present invention; it is preferred that the value be determined utilizing a "remaining battery capacity estimation" procedure according to a further embodiment of the present invention.

In this regard, traditional techniques for determining a remaining battery capacity value typically utilize a coulomb counter to determine used battery capacity. As indicated previously, the used battery capacity is then subtracted from the total battery capacity to provide a value for the remaining battery capacity. Not all mobile telephones or other electronic devices, however, have a hardware coulomb counter or the device platform does not allow for the development of an accurate software coulomb counter. In accordance with the present invention, the need for a very accurate coulomb counter is eliminated; and, instead, the battery cell voltage is used to accurately estimate the remaining battery capacity.

Procedures are known which use the battery voltage to estimate the remaining capacity of a battery. Such procedures, however, are unreliable as a result of various factors including the battery impedance and chemical reactions taking place in the cells. The battery impedance changes over the life of the battery and also changes due to temperature. The present invention eliminates the effect of the battery impedance by measuring the battery voltage when the battery current approaches 0 mA. The manner in which this is accomplished can best be understood with reference to FIGS. 5 and 6.

Figure 5:
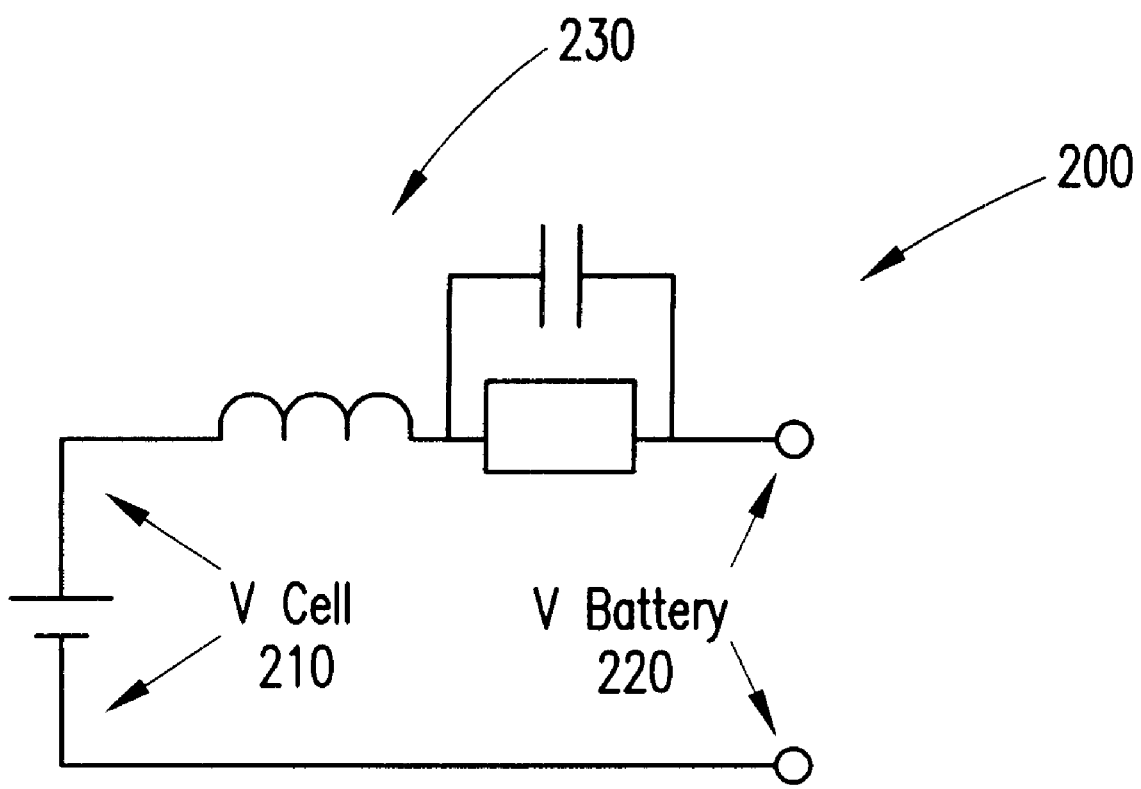
FIG. 5 is a schematic depiction of an electric circuit in a battery used to power a portable electronic device.

In particular, FIG. 5 schematically illustrates a depiction of an electrical circuit 200 defined by a battery such as battery 28 in FIG. 2. The cell voltage, i.e., the voltage across the battery cell or cells, is shown at 210 and the battery voltage, i.e., the voltage across the terminals of the battery itself is shown at 220. As should be apparent from FIG. 5, when the battery voltage 220 is used to estimate remaining battery capacity; the battery impedance illustrated at 230 will normally affect the accuracy of the measurements. The cell voltage 210, however, will not be affected by the battery impedance 230. It should also be apparent from FIG. 5, that when the battery current approaches 0 mA, the battery voltage 220 will approach the cell voltage 210; and, at this time, therefore, any effects on the measurement due to the battery impedance will be removed.

The battery cell chemistry remains active, and thus will also have an influence on the voltage measurement, for some period of time after charging or discharging. Tests have shown, however, that after about 10 minutes, the chemical reactions will have sufficiently stabilized to permit reliable measurements to be made.

In mobile telephones manufactured by the applicant, battery current is very low during "sleep" or "idle" modes (less than 10 mA). Therefore, in mobile telephones manufactured by the applicant, 10 minutes after the battery voltage drops below 10 mA, the battery voltage can be measured to provide an accurate estimate of the used battery capacity from which the remaining battery capacity can be calculated. The relationship between the battery voltage and the used battery capacity is clearly illustrated by the graph of FIG. 6 which shows battery discharge curves with a 10 mA load.

Figure 6:
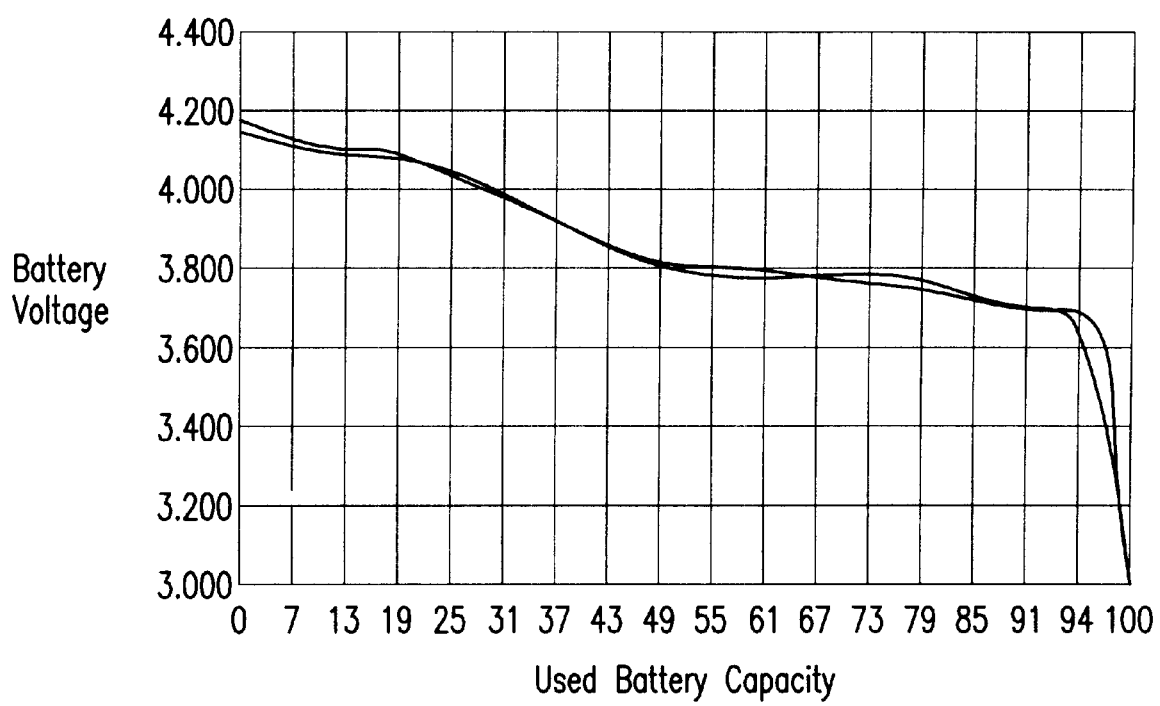
FIG. 6 is a graph provided to assist in explaining an embodiment of the present invention.

In FIG. 6, the X-axis represents the used battery capacity in %, and the Y-axis represents the battery voltage in volts. Three different types of batteries were used, Lithium-Ion 600 mAhr, Lithium-ion 1400 mAhr and Lithium-Pol 600 mAhr. As is apparent from the graph, there is a direct correlation between the battery voltage and the used battery capacity; and, as indicated above, the used battery capacity can be used to provide an estimate of the remaining battery capacity.

Figure 7:
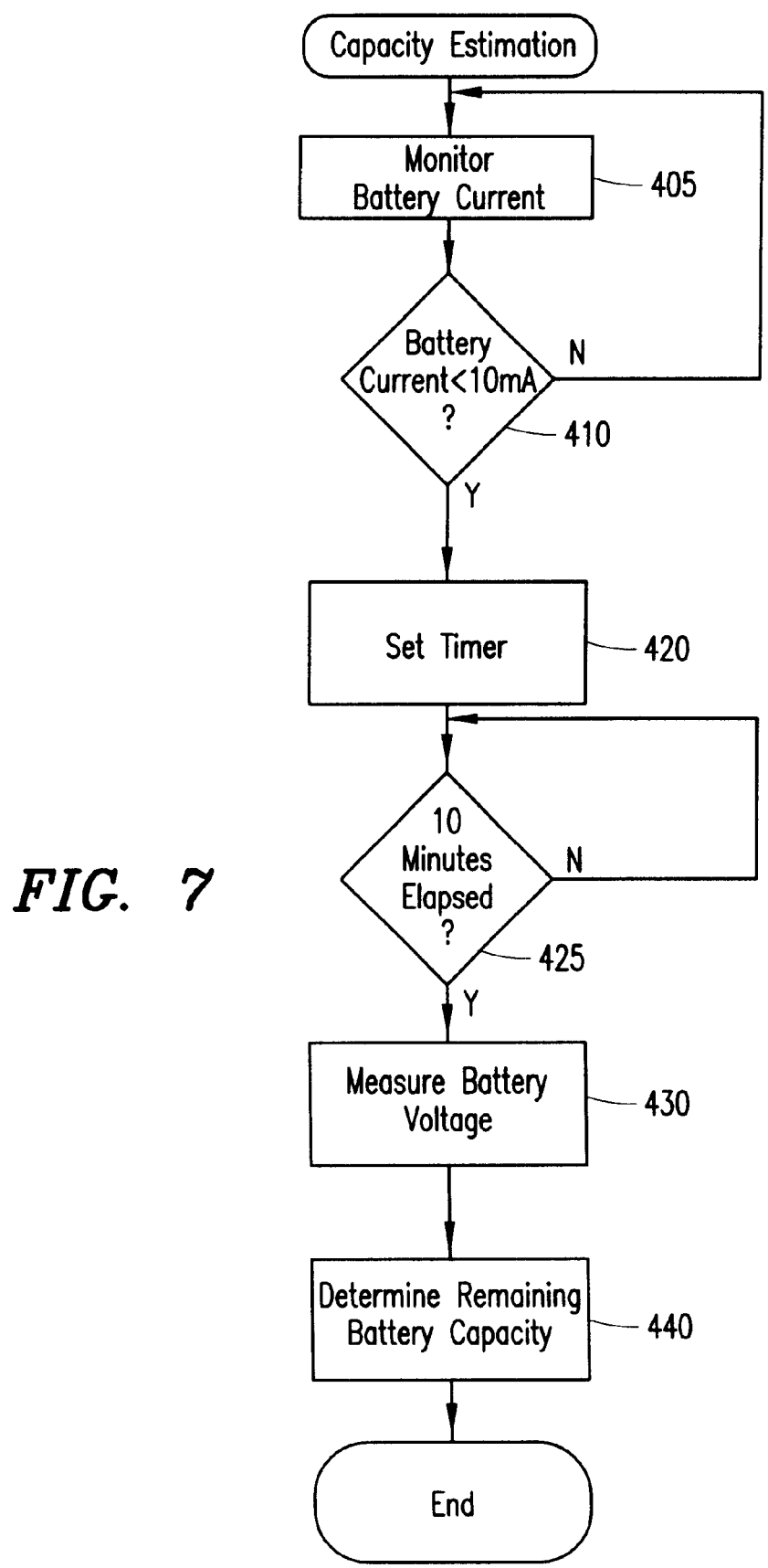
FIG. 7 is a flow chart illustrating steps of a remaining battery capacity estimation procedure according to a second embodiment of the present invention.

FIG. 7 is a flow chart illustrating the steps of a remaining battery capacity estimation procedure according to a presently preferred embodiment of the invention. Initially, as shown in FIG. 7, the battery current is monitored (step 405) in any desired manner which maybe continuous or periodic. For the reasons explained above, it is preferred that the estimation be made only when the battery current is sufficiently low; i.e., less than about 10 mA; and the monitoring continues until the battery current, in fact, drops below 10 mA (Y output of step 410). As indicated above, this typically occurs when the device is in an "idle" or "sleep" mode. If the battery current is sufficiently low, a timer is then set (step 420) so as to permit any chemical reactions in the cell or cells to stabilize, as also discussed above. After, for example, 10 minutes (Y output of step 425), the battery voltage is measured (step 430), and the measurement is used to determine a remaining battery capacity value for the battery (step 440). A remaining battery capacity value can be determined from the battery voltage utilizing, for example, an algorithm based on the graph shown in FIG. 6, via a look-up table or by a polynomial equation.

When the remaining battery capacity value has been determined, this value can be stored and added to the total capacity accepted by the battery during the charging process described with reference to FIG. 4, to provide a value of the total capacity of the battery, which can then be used to update the total battery capacity parameter (step 135 in FIG. 4).

For the remaining battery capacity estimation procedure described above with reference to FIG. 7 to be most effective, it is desirable that the battery be characterized at approximately the same discharge current when the terminal is in the "sleep" or "idle" mode. For optimal results, the discharge current should be the same to within about +/−5 mA. The telephone should also be in a "sleep" or "idle" mode for at least about 10 minutes, as indicated above. This will normally not be a problem as most phone users do not use their phone continuously.

Tests indicate that a remaining battery capacity value estimated by the procedure of the present invention is accurate to within about 2% with a 10 mV resolution ADC. Filtering techniques can also be used to increase the accuracy to about 1 mV if desired.

It should also be noted from the graph of FIG. 6, that if the remaining capacity of the battery is above about 80%, the estimation will be less accurate. This will usually not be a problem, however, as the remaining battery capacity will normally be relatively low when it is recharged, and opportunities to provide the estimation when the capacity is relatively low will normally present themselves.

The particular algorithm used to estimate remaining battery capacity from the battery voltage could be tailored to the specific cell type used in the battery, if desired, to accommodate for the slight differences in the battery voltage/used battery capacity relationship of different cells as shown in FIG. 6. Thus, the step of determining remaining battery capacity in FIG. 7 can include the step of first determining the the cell type of the battery and selecting the appropriate algorithm for that type of cell to determine the remaining battery capacity. It is also possible, if desired, to design the procedure of FIG. 7 such that an estimation is not made until the battery voltage drops to a particular level so as to speed up the procedure somewhat.

Although the above description of the remaining battery capacity estimation procedure explains the procedure in conjunction with an overall procedure for calibrating a battery during charging of the battery, it should be understood that the capacity estimation procedure is not limited to use in such an application. The procedure can be used by itself or in conjunction with another calibration or fuel gauging application to provide a measure of remaining battery capacity.

As mentioned above, when a user of a mobile telephone or another portable electronic device does not allow the battery to be fully charged, or if the battery is prevented from being fully charged for another reason, such that an accurate calibration during charging cannot be performed in accordance with the present invention, it is desirable that some alternative calibration procedure be performed in any event. A conventional calibration based on ageing of the battery can be performed, if desired or necessary, however, as discussed above, this is not a very accurate procedure. According to the present invention, however, calibration can be achieved utilizing dynamic battery capacity updating procedures according to further embodiments of the invention.

In order to provide a clear understanding of this aspect of the present invention, two possible scenarios that might arise should be considered:

Scenario (a). In this scenario, the total battery capacity parameter that has been programmed into the electronic device is lower than the true total battery capacity. In this situation, a calibration procedure should increase the value of the total battery capacity parameter. Such a situation commonly arises when a battery is replaced with a fresh, new battery, and may also occur, as indicated above, when the programmed parameter is based on the nominal value provided by the cell vendor.

Scenario (b). In this scenario, the device is programmed with a total battery capacity parameter that is higher than the true total battery capacity. In this situation, a calibration procedure should decrease the value of the total battery capacity parameter. This situation typically arises when the battery has been recharged many times and loses some of its recoverable battery capacity, and can also occur from an inaccurate nominal value provided by the cell vendor.

According to one embodiment of the present invention, a calibration is performed dynamically during normal use of the device by utilizing a predicting algorithm which predicts the remaining battery capacity. This procedure is illustrated by the flow chart in FIG. 8.

Figure 8:
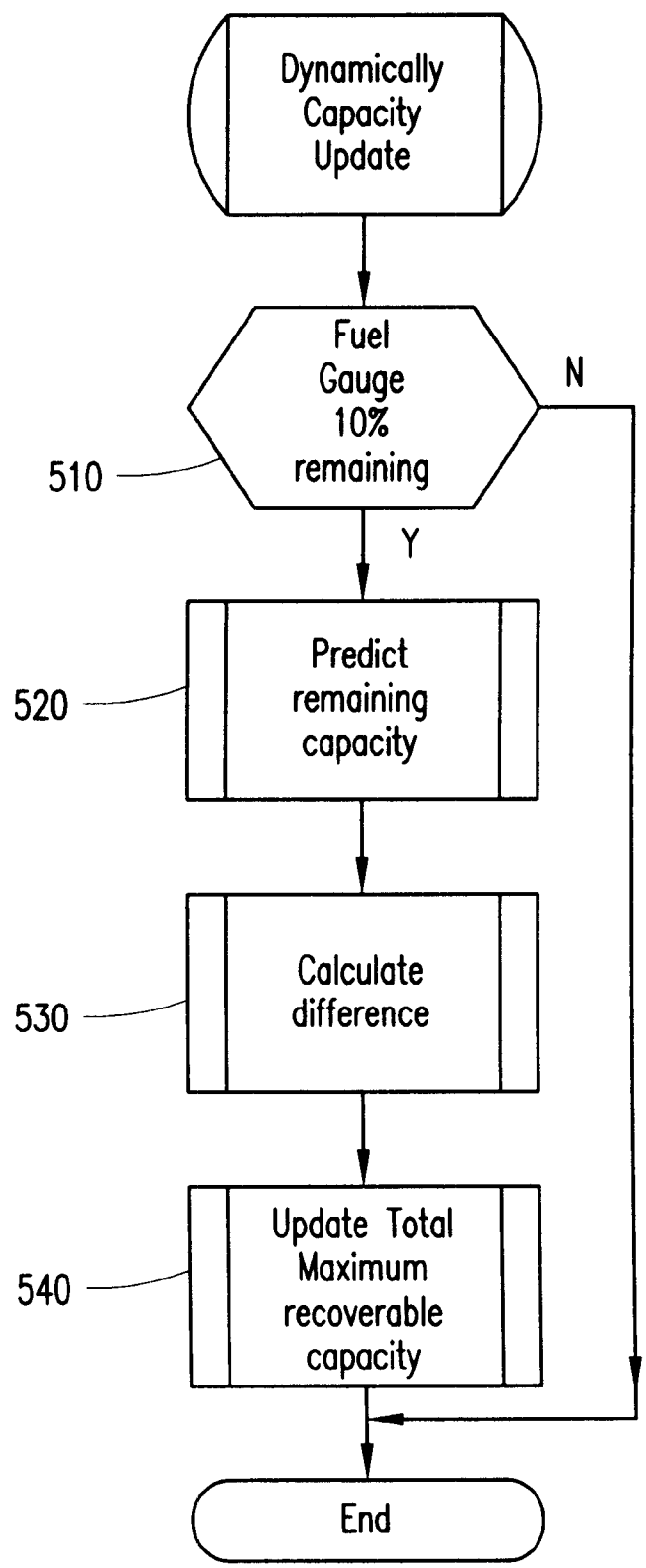
FIG. 8 is a flow chart illustrating steps of a dynamic total battery capacity updating procedure according to a third embodiment of the present invention.

Initially, the calibration procedure according to this embodiment is preferably carried out when the fuel gauge indicates a specific, relatively low remaining battery capacity. In FIG. 8, the specific remaining battery capacity is 10% of the total battery capacity value programmed into the device; although it should be understood that it is not intended to restrict the invention to any particular percentage. If the fuel gauge indicates that other than 10% of the programmed total battery capacity value remains (N output of step 510), the procedure is not carried out. If, however, the fuel gauge indicates that 10% of the programmed total battery capacity value remains (Y output of step 510); a prediction or estimate of the remaining battery capacity is made (step 520). This prediction can be made, for example, based on the most recent estimate of the remaining capacity made by the remaining capacity estimation procedure described with reference to FIG. 7, or by some other estimation procedure. If the prediction of the remaining capacity is different from the 10% amount indicated as remaining by the fuel gauge, as calculated in step 530, the difference is then used to update the total capacity value of the battery (step 540).

For example, according to scenario (a) above, if the fuel gauge indicates that 100 mA of capacity remains, but the estimate suggests that 150 mAhr remains, the total battery capacity value gets updated by increasing the value. On the other hand, according to scenario (b), if the fuel gauge indicates 100 mAhr of remaining capacity but the prediction is 50 mAhr, the total battery capacity value gets updated by decreasing the value.

According to an alternative embodiment of the invention, calibration is performed dynamically during normal use of the device by a procedure that does not require a prediction of the remaining capacity of the battery. This embodiment is illustrated by the flow chart of FIG. 9.

In particular, during use of the device, a determination is made whether the fuel gauge indicates that the battery is empty (step 610). If it indicates empty (Y output of step 610), any continued usage of the battery is monitored and the additional used capacity is accumulated (step 620). This accumulation is continued until the battery is actually empty (Y output of step 630) or until a procedure is initiated to charge the battery (N output of step 630). If charging is initiated before the battery is empty, the procedure stops. If the battery is actually empty, the accumulated additional charge is used to calculate the difference between the total capacity value indicated by the fuel gauge and the total capacity value indicated by the accumulated additional charge (step 640); and this difference is used to update the total battery capacity parameter in step 650.

On the other hand, if the fuel gauge does not indicate empty (N output of step 610) but the battery is, in fact, empty (Y output of step 660), the difference between the remaining capacity indicated by the fuel gauge and the actual total capacity of the battery is calculated in step 640; and this value is used to update the total battery capacity parameter in box 650.

Of course, if the fuel gauge indicates empty and the battery is, in fact empty (N output of step 660), the process stops as no calibration is needed.

In either of the procedures described above with reference to FIGS. 8 and 9, in order to prevent extreme adjustments to the total battery capacity value, a damping factor should be applied to the process. For example, if the total battery capacity programmed into the device is 600 mAhr, but the procedure indicates a capacity of 700 mAhr, a percentage of the difference, e.g., 25%, is adjusted for as a result of the calibration. In this case, the new total battery capacity is 600 mAhr+25 mAhr=625 mAhr. Alternatively, the adjustment can be by a fixed percentage up or down, of the previously stored total capacity value.

Figure 9:
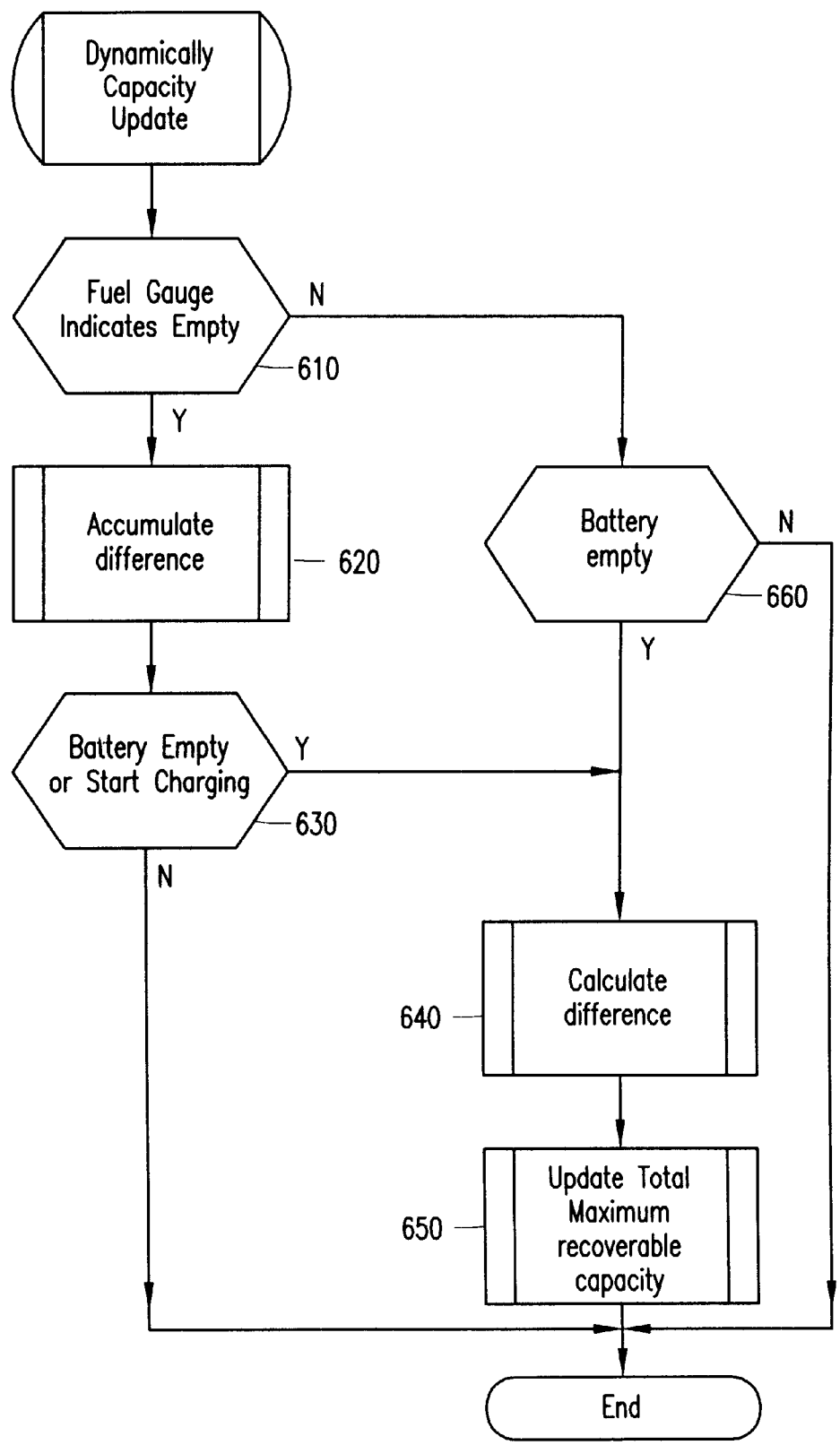
FIG. 9 is a flow chart illustrating steps of a dynamic total battery capacity updating procedure according to a fourth embodiment of the present invention.

Again, although the procedures of FIGS. 8 and 9 have been described in conjunction with a procedure for calibrating a battery during charging of the battery; it is to be understood that the procedures can be used by themselves or in conjunction with other procedures to provide a battery calibration.

Figure 10:
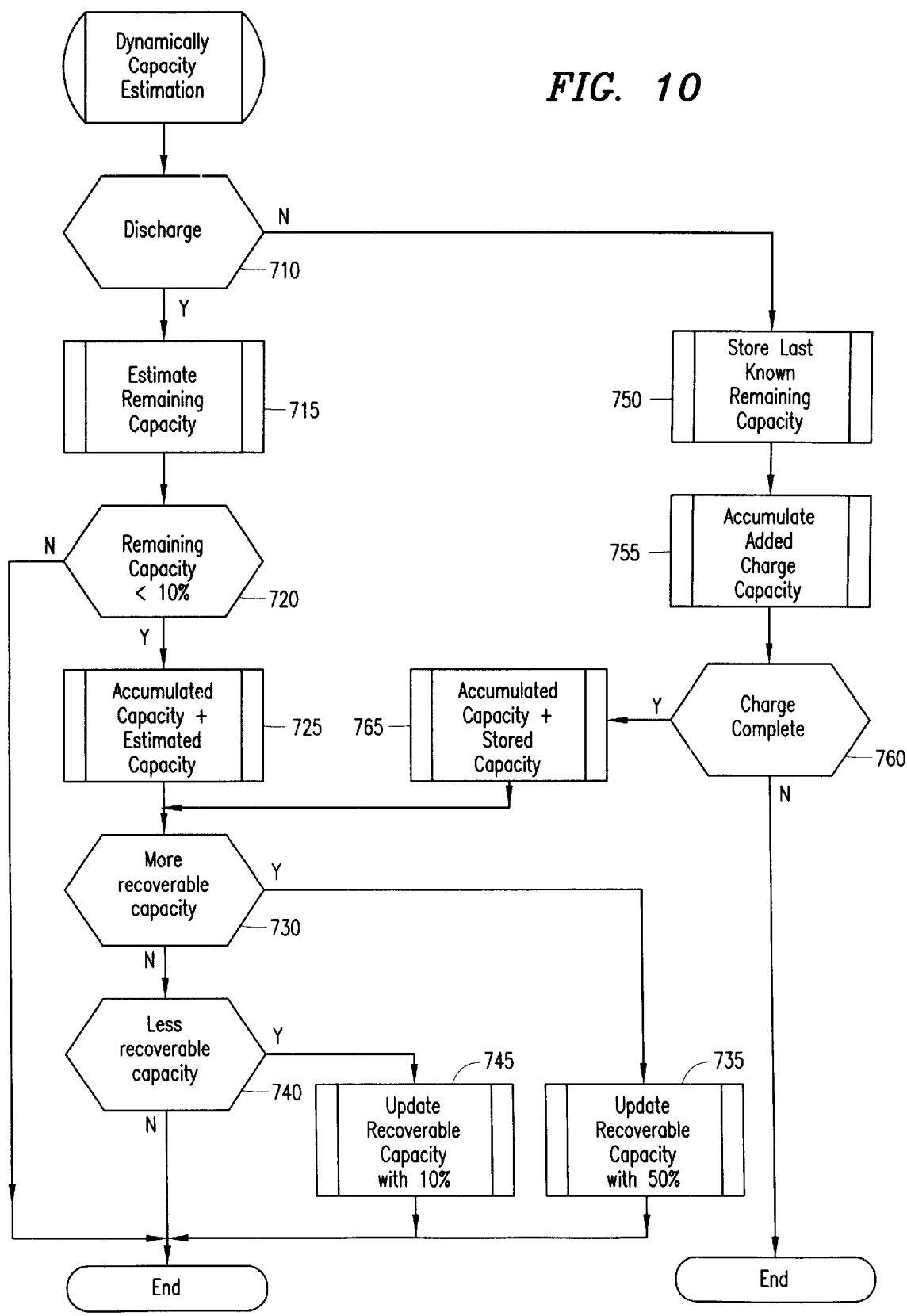
FIG. 10 is a flow chart illustrating steps of a dynamic total battery capacity updating procedure according to a fifth embodiment of the present invention.

FIG. 10 is a flow chart that illustrates a calibration procedure according to a further embodiment of the present invention.

Initially, as the battery is continuing to be discharged during use (Y output of step 710), the usage is monitored and an estimate is periodically or otherwise made of the remaining capacity of the battery (box 715). As long as the remaining capacity of the battery remains at 10% or more while it is being monitored (N output of step 720), nothing more is done and the process stops. When, however, the remaining capacity drops to less than 10% (Y output of step 720), a comparison is made of the most recent estimated remaining capacity value and the capacity indicated by the fuel gauge (step 725). If the comparison indicates that the actual total capacity of the battery is greater than previously programmed into the device (Y output of step 730), the total capacity value of the battery is updated by increasing the total battery capacity value (step 735).

On the other hand, if the results of the comparison in step 725 is that the total capacity of the battery is less than previously stored (N output of step 730 and Y output of step 740), the total capacity value is updated by reducing the total capacity value at step 745.

If, during monitoring of the battery usage, it is determined that the battery is no longer being discharged during normal use (N output of step 710), the last known remaining capacity is stored (step 750). When the battery is charged, the total capacity added to the battery during the charging process is accumulated (step 755) until the battery is fully charged. If the charge is interrupted or not completed, as described previously, the procedure ends (N output of step 760). If the charging process is completed, however (Y output of step 760), the accumulated charge during the charging process is added to the remaining capacity value stored in step 750 to provide a total battery capacity value in step 765. This value is then used to determine if the previously stored total capacity value needs to be adjusted upwardly or downwardly; and if so, the total capacity parameter is updated accordingly.

As should be apparent from the above description, by dynamically estimating the remaining capacity of the battery as the battery is being used during normal use of the device, if the battery is charged without first fully discharging the battery, a value of remaining battery capacity is used to enable a good quality calibration to be carried out during a normal charging process. At the same time, by dynamically providing an estimate of remaining battery capacity during use of the battery, even if the battery is not fully charged during the charging process, an effective calibration can still be achieved by directly using the remaining capacity estimation to update the total capacity value. Thus, in accordance with the present invention, a calibration will be performed periodically on a battery notwithstanding the usage habits of the particular user of a device.

The method according to the present invention is fully automatic and does not require any interaction from the user (other than his initiating the normal charging process). The procedure is also fully adaptive inasmuch as a calibration will automatically be performed whenever the opportunity presents itself but will normally not be performed if there is a risk of inaccurate measurements. As indicated above, the type of calibration that is performed at any one time will depend on the manner in which the user uses his device, i.e., whether he fully charges the battery, whether the battery is fully discharged before charging and the like. The calibration procedures according to the present invention can also be effectively used with both smart and dumb batteries.

As in the previous embodiments, it is desirable that any single update of the total battery capacity value be limited to some appropriate maximum amount so as to avoid extreme adjustments that would be noticeable to the user, or in case a particular calibration is inaccurate for some reason. This maximum amount can differ depending on whether the total battery capacity value is increased or decreased. For example, it maybe desirable that decreases in the total battery capacity value be by a lesser maximum amount than increases in the value. As an example, an increase in the total battery capacity value can be limited to about 50% of the indicated required adjustment, while decreases can be limited to about 10% of the indicated required adjustment.

With the present invention, calibration will tend to be performed more frequently than in prior procedures thus providing an overall increase in fuel gauging accuracy. The method of the invention also does not require any dedicated hardware as all the necessary hardware for the charging process is already available.

It should be understood that the term "comprises/comprising" when used in this specification is taken to specify the presence of stated features, integers, steps or components; but does not preclude the presence or addition of one or more other features, integers, steps, components or groups thereof.

While what has been described herein constitutes presently preferred embodiments of the invention, it should be understood that the invention could be varied in numerous ways. For example, although the invention has been describes primarily in connection with calibrating a battery used in a cellular telephone so that a reliable prediction can be made of the remaining talk/standby time of the telephone; it can be used to calibrate batteries used in other mobile terminals and electronic devices so as to permit reliable prediction of the remaining operational times of those devices. For example, the present invention can be readily used to predict the remaining operational times of games, WAP and other devices as well as accessories therefor. Also, even though the various dynamic calibration procedures described above have been described as being used in connection with a procedure for calibrating a battery during charging of the battery; it is not intended to so restrict the invention. The calibration procedure during a normal charging of the battery can be utilized by itself without the alternative calibration procedures, if desired; and the various alternative calibration procedures can be used independently of one another and independent of the calibration during charging of the battery.

Because the invention can be varied in numerous ways without departing from the scope thereof, it should be recognized that the invention should be limited only insofar as is required by the scope of the following claims.

What is claimed is:

1. A method for calibrating a rechargeable battery for an electronic device comprising:
   charging the battery by a charging process;
   determining a total amount of charge accepted by the battery during the charging process; and
   providing a value of total battery capacity of the battery based, at least in part, on the total amount of charge accepted by the battery.

2. The method according to claim 1, wherein said battery is completely discharged before said charging step is initiated.

3. The method according to claim 2, and further including the step of completely discharging said battery before said charging step is initiated, and wherein said charging step comprises fully charging said battery such that the total amount of charge accepted by said battery comprises the total battery capacity value.

4. The method according to claim 1, wherein said determining step comprises determining a net current fed into the battery during the charging process and a duration of the charging process to determine the total amount of charge accepted by the battery.

5. The method according to claim 4, wherein said step of determining a net current fed into the battery comprises measuring a charging current and a current consumption of the electronic device, and calculating therefrom the net current fed into the battery.

6. The method according to claim 1, and further including the step of updating a total battery capacity parameter using said provided value of total battery capacity.

7. The method according to claim 6, and further including the step of predicting a remaining operational time of said device using said updated total battery capacity parameter.

8. The method of claim 7, wherein said device comprises a mobile telephone, and wherein said step of predicting a remaining operational time comprises predicting a remaining talk/standby time of said mobile telephone.

9. The method according to claim 1, and further including the step of providing a value of remaining battery capacity of the battery prior to initiation of the charging step, and wherein the step of providing a value of total battery capacity comprises the step of adding the provided remaining battery capacity value and the total amount of charge accepted by the battery during the charging process to provide the total battery capacity value.

10. The method according to claim 9, wherein said battery includes at least one battery cell, and wherein said step of providing a value of remaining battery capacity comprises the steps of determining a voltage across said at least one cell, and determining said remaining battery capacity value as a function of said voltage across said at least one cell.

11. The method according to claim 10, wherein said step of determining a voltage across said at least one cell comprises the step of measuring battery voltage when battery current is sufficiently low that said battery voltage is substantially equal to said voltage across said at least one cell.

12. The method according to claim 11, wherein said sufficiently low battery current is less than about 10 mA.

13. The method according to claim 11, and further including the step of waiting a period of time after said battery current is sufficiently low before measuring said battery voltage to stabilize chemical reactions in said at least one cell.

14. The method according to claim 13, wherein said period of time is at least about 10 minutes.

15. The method according to claim 1, wherein said charging step comprises the step of fully charging said battery, and wherein said method further includes the step of calibrating said battery by an alternative calibration procedure if said charging step does not fully charge said battery.

16. The method according to claim 15, wherein said alternative calibration procedure comprises a calibration procedure based on ageing of the battery.

17. The method according to claim 15, wherein said alternative calibration procedure includes monitoring said battery during use of said device.

18. The method according to claim 17, wherein said monitoring step includes the steps of predicting a remaining battery capacity value of the battery, and calculating a difference between said predicted remaining battery capacity value and a remaining battery capacity value determined by a fuel gauge of said device, and updating the total battery capacity value in accordance with said difference.

19. The method according to claim 18, wherein said step of predicting the remaining battery capacity value is made when the remaining battery capacity value determined by said fuel gauge is at a specified value.

20. The method according to claim 19, wherein said specified value is about 10% of the total battery capacity value of said battery programmed into said device.

21. The method according to claim 18, wherein said updating step comprises updating said total battery capacity value by no more than a specified maximum amount as a result of any one calibration procedure.

22. The method according to claim 17, wherein said alternative calibration procedure comprises determining either an actual remaining battery capacity of said battery after a fuel gauge of said device indicates that said battery is empty, or a remaining battery capacity value indicated by said fuel gauge when said battery is actually empty, and updating a total battery capacity value as a result of said determination.

23. The method according to claim 22, wherein said updating step is by no more than a predetermined maximum value during any one calibration procedure.

24. The method according to claim 1, wherein said device comprises a mobile terminal.

25. The method according to claim 24, wherein said mobile terminal comprises a mobile telephone.

26. The method according to claim 1, wherein said battery comprises a smart battery.

27. The method according to claim 1, wherein said battery comprises a dumb battery.

28. An apparatus for calibrating a rechargeable battery for an electronic device comprising:
 a charging circuit for charging said battery,
 a determiner which determines the total amount of charge accepted by the battery during charging; and
 a provider which provides a total battery capacity value for said battery based, at least in part, on the total amount of charge accepted by the battery.

29. An apparatus according to claim 28, wherein said charging circuit includes a discharger for fully discharging said battery before being charged.

30. An apparatus according to claim 28, and further including a memory for storing a remaining battery capacity value prior to charging said battery, and wherein said provider provides said total battery capacity value based on both said remaining battery capacity value and said total amount of charge accepted by said battery during charging.

31. An apparatus according to claim 29, and further including a monitor which monitors said battery during use of said device and determines said remaining battery capacity value.

32. The apparatus according to claim 28, and further including a user advising member for advising a user of the device of remaining operational time of said device using on said total battery capacity value.

33. The apparatus according to claim 32, wherein said advising member comprises a display on said device.

34. The apparatus according to claim 33, wherein said device comprises a mobile telephone, and wherein said display displays remaining talk/standby time of said telephone.

35. A method for determining remaining battery capacity of a battery for an electronic device, said battery including at least one battery cell, the method comprising:

determining a voltage across said at least one battery cell; and determining a remaining battery capacity value as a function of said voltage across said at least one battery cell, wherein said step of determining a voltage across said at least one battery cell comprises measuring battery voltage when said battery current is sufficiently low that said battery voltage is substantially equal to said voltage across said at least one battery cell.

36. The method according to claim 35, wherein said sufficiently low battery current is less than about 10 mA.

37. The method according to claim 35, and further including the step of waiting a period of time after said battery current is sufficiently low before measuring said battery voltage to stabilize any chemical reactions in said at least one cell.

38. The method according to claim 37, wherein said period of time comprises at least about 10 minutes.

39. A method for calibrating a battery of an electronic device, comprising:

monitoring used battery capacity of said battery during use of said device and providing a monitored remaining battery capacity value therefrom;

predicting a remaining battery capacity value of said battery, calculating a difference between said predicted remaining battery capacity value and said monitored remaining battery capacity value; and updating a total capacity value of said battery as a result of said difference.

40. The method according to claim 39, wherein said prediction is made when said monitored remaining battery capacity value is at a specified amount.

41. The method according to claim 40, wherein said specified amount is about 10% of a total battery capacity value programmed into said device.

42. The method according to claim 39, wherein said updating step updates said total battery capacity value by no more than a predetermined amount as a result of any one calibration.

43. A method for calibrating a battery of an electronic device, comprising:

monitoring said battery during use of said device to determine a difference between a remaining battery capacity value indicated by a fuel gauge of said device and an actual remaining battery capacity value; and updating a total battery capacity value stored in said device as a result of said difference.

44. The method according to claim 43, wherein said monitoring step comprises measuring an additional charge capacity of said battery after said fuel gauge indicates that said battery is empty.

45. The method according to claim 43, wherein said monitoring step comprises determining the total battery capacity value indicated by said fuel gauge when said battery is actually empty.

46. The method according to claim 43, wherein said updating step updates a stored total battery capacity value by no more than a predetermined maximum amount as a result of any one calibration procedure.

* * * * *